US012736589B2

(12) United States Patent
Lee et al.

(10) Patent No.: US 12,736,589 B2
(45) Date of Patent: Sep. 15, 2026

(54) APPARATUS FOR DIAGNOSING STATE OF BATTERY AND METHOD THEREOF

(71) Applicants: HYUNDAI MOTOR COMPANY, Seoul (KR); Kia Corporation, Seoul (KR)

(72) Inventors: Bo Hyun Lee, Incheon (KR); Ju Seok Kim, Suwon-si (KR); Yo Han Baek, Anyang-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 52 days.

(21) Appl. No.: 18/589,154

(22) Filed: Feb. 27, 2024

(65) Prior Publication Data

US 2025/0093424 A1 Mar. 20, 2025

(30) Foreign Application Priority Data

Sep. 18, 2023 (KR) ........................ 10-2023-0124147

(51) Int. Cl.

| | |
|---|---|
| ***G01R 31/367*** | (2019.01) |
| ***B60L 58/16*** | (2019.01) |
| ***G01R 31/389*** | (2019.01) |
| ***G01R 31/392*** | (2019.01) |
| ***H02J 7/00*** | (2026.01) |
| ***H02J 7/82*** | (2026.01) |

(52) U.S. Cl.

CPC ............ *G01R 31/392* (2019.01); *B60L 58/16* (2019.02); *G01R 31/367* (2019.01); *G01R 31/389* (2019.01); *H02J 7/82* (2026.01)

(58) Field of Classification Search

CPC ................ G01R 31/392; G01R 31/389; G01R 31/367601; G01R 58/16; H02J 7/0048

USPC ...................... 324/500, 600, 76.11, 415–433

See application file for complete search history.

(56) References Cited

U.S. PATENT DOCUMENTS

| | | | | |
|---|---|---|---|---|
| 2018/0196107 | A1* | 7/2018 | Fleischer | G01R 31/367 |
| 2019/0210472 | A1* | 7/2019 | Hackner | G01R 31/3842 |
| 2019/0288520 | A1* | 9/2019 | Abdel-Monem | G01R 31/392 |
| 2022/0158255 | A1* | 5/2022 | Choi | H01M 10/425 |
| 2023/0133120 | A1* | 5/2023 | Jang | G07C 5/0808 702/63 |
| 2023/0278431 | A1 | 9/2023 | Kim et al. | |
| 2023/0318346 | A1* | 10/2023 | Fasching | H02J 7/82 |
| 2023/0366937 | A1* | 11/2023 | Katrasnik | G01R 31/367 |

(Continued)

FOREIGN PATENT DOCUMENTS

| | | |
|---|---|---|
| CN | 102354451 | 2/2012 |
| JP | 2021-163649 | 10/2021 |

(Continued)

*Primary Examiner* — Giovanni Astacio-Oquendo
*Assistant Examiner* — Trung Q Nguyen
(74) *Attorney, Agent, or Firm* — Fish & Richardson P.C.

(57) ABSTRACT

Disclosed are an apparatus for diagnosing a state of a battery and a method thereof. The apparatus diagnoses the state of the battery with high accuracy in a short time period by obtaining first state information of the battery from a battery management system (BMS), obtaining second state information of the battery from electrochemical impedance spectroscopy (EIS) equipment, obtaining third state information of the battery from a history management server, and diagnosing the state of the battery based on the first state information, the second state information and the third state information.

20 Claims, 7 Drawing Sheets

(56) References Cited

U.S. PATENT DOCUMENTS

| | | | | |
|---|---|---|---|---|
| 2023/0398902 | A1* | 12/2023 | Huang | B60L 58/16 |
| 2024/0044827 | A1* | 2/2024 | Ishigaki | G01R 31/389 |
| 2024/0377458 | A1* | 11/2024 | Munakata | G01R 31/367 |

FOREIGN PATENT DOCUMENTS

| | | |
|---|---|---|
| KR | 10-2012-0026231 | 3/2012 |
| KR | 10-2289155 | 8/2021 |
| KR | 10-2022-0027791 | 3/2022 |
| KR | 10-2022-0057861 | 5/2022 |
| KR | 10-2023-0034029 | 3/2023 |

* cited by examiner

APPARATUS FOR DIAGNOSING STATE OF BATTERY AND METHOD THEREOF

CROSS-REFERENCE TO RELATED APPLICATION

This application claims the benefit of priority to Korean Patent Application No. 10-2023-0124147, filed in the Korean Intellectual Property Office on Sep. 18, 2023, the entire contents of which are incorporated herein by reference.

TECHNICAL FIELD

The present disclosure relates to a technology for quickly diagnosing the state of a battery for an electric vehicle.

BACKGROUND

In general, an electric vehicle, which is a vehicle driven by electric energy, is equipped with a battery including a plurality of battery cells that store electric energy. Such battery cells convert chemical energy into electrical energy to supply electrical energy (discharge), or convert electrical energy supplied from an outside into chemical energy to store it (charge).

Because an electric vehicle is driven using electrical energy stored in a battery as a power source, the performance of the vehicle is determined by the performance of the battery. Therefore, in order to improve the performance of an electric vehicle, it is required to manage the battery to maximize the performance.

In recent years, because battery cells with excellent performance are used to improve the power source of a vehicle, and the number of battery cells increases gradually, it is more required to manage a battery. Such battery management is generally performed by a battery management system (BMS).

The battery management system measures cell state information including a voltage, a current, a temperature, and the like of a battery cell from a battery module provided in an electric vehicle, uses the cell state information and option values for controlling battery cells to manage the battery cells, and performs cell balancing to maintain balance between the battery cells.

The cell balancing is one of the control operations of a battery management system that equalizes the voltages or charge amounts of battery cells. Each battery cell of a battery module may have differences in electrical characteristics even when the battery cells are manufactured under the same manufacturing conditions and environment, and may also have differences in electrical characteristics even when the battery cells are mounted and operated in an electric vehicle.

Due to such differences in electrical characteristics, even when battery cells are charged and discharged with the same current, voltage imbalance or residual charge imbalance may occur between interconnected battery cells, and the voltage imbalance or residual charge imbalance between battery cells may cause the available voltage range of battery cells to decrease or the charging and discharging cycle to be shorter.

Meanwhile, as the number of scrapped electric vehicles increases rapidly, there are active discussions on how to utilize the batteries provided in the electric vehicles, and as a technology for supporting it, a technology that can test the performance of a battery is required. For reference, when the state of health (SOH) of an electric vehicle battery falls below 70%, its capacity performance can no longer be used for electric vehicles.

A conventional battery diagnosis system diagnoses the state of a battery based on the cell voltage difference and insulation resistance of the battery provided in a vehicle. Because the conventional technology requires testing the performance of a battery while repeatedly charging and discharging for 20 hours, the test takes a long time and has limitations in accommodating all batteries especially when the number of batteries to be tested is large.

SUMMARY

An aspect of the present disclosure provides an apparatus for diagnosing a state of a battery and a method thereof that may diagnose the state of the battery with high accuracy in a short time period by obtaining first state information of the battery from a battery management system (BMS), obtaining second state information of the battery from electrochemical impedance spectroscopy (EIS) equipment, obtaining third state information of the battery from a history management server, and diagnosing the state of the battery based on the first state information, the second state information and the third state information.

Another aspect of the present disclosure provides an apparatus for diagnosing a state of a battery and a method thereof that may diagnose the state of the battery with high accuracy in a short time period by obtaining a first state of health (SOH) of the battery and diagnostic trouble code information related to an overcharge and over-discharge of the battery from the BMS, determining a first safety level of the battery based on a table in which a safety level corresponding to the DTC is recorded, obtaining a Nyquist plot of the battery from electrochemical impedance spectroscopy (EIS) equipment, determining a resistance, a reactance, and a Warburg impedance based on the Nyquist plot, determining a second SOH of the battery based on a table in which SOH corresponding to the resistance, reactance, and Warburg impedance is recorded, determining a second safety level of the battery based on a table in which a safety level corresponding to the resistance, reactance, and Warburg impedance is recorded, obtaining a third SOH and a third safety level of the battery from the history management server, and diagnosing the state of the battery based on the first SOH, the first safety level, the second SOH, the second safety level, and the third SOH and the third safety level.

Still another aspect of the present disclosure provides an apparatus for diagnosing a state of a battery and a method thereof that may diagnose the state of the battery with high accuracy in a short time period by obtaining a state of health (SOH) of the battery and diagnostic trouble code (DTC) information related to overcharge and over-discharge of the battery from a battery management system (BMS), determining the safety level of the battery based on a table in which the safety level corresponding to the DTC is recorded, diagnosing the state of the battery based on the SOH and safety level of the battery.

Still another aspect of the present disclosure provides an apparatus for diagnosing a state of a battery and a method thereof that may diagnose the state of the battery with high accuracy in a short time period by obtaining a Nyquist plot of the battery from electrochemical impedance spectroscopy (EIS) equipment, determining a resistance, a reactance, and a Warburg impedance based on the Nyquist plot, determining a second SOH of the battery based on a table in which SOH corresponding to the resistance, reactance, and Warburg impedance is recorded, determining a safety level of the battery based on a table in which a safety level corresponding to the resistance, reactance, and Warburg impedance is recorded, and diagnosing the state of the battery based on the SOH and the safety level of the battery.

Still another aspect of the present disclosure provides an apparatus for diagnosing a state of a battery and a method thereof that may diagnose the state of the battery with high accuracy in a short time period by obtaining a SOH and a safety level of the battery from a history management server, and diagnosing the state of the battery based on the SOH and the safety level.

The technical problems to be solved by the present disclosure are not limited to the aforementioned problems, and any other technical problems not mentioned herein will be clearly understood from the following description by those skilled in the art to which the present disclosure pertains. Also, it may be easily understood that the objects and advantages of the present disclosure may be realized by the units and combinations thereof recited in the claims.

According to an aspect of the present disclosure, an apparatus for diagnosing a state of a battery includes a controller that obtains at least one of first state information including a first state of health (SOH) used for diagnosing the battery, second state information including a second SOH used for diagnosing the battery, or third state information including a third SOH used for diagnosing the battery, or a combination thereof, and diagnose the state of the battery based on at least one piece of the first state information, the second state information, or the third state information, or the combination thereof, and an output device that outputs a diagnosis results of the controller, wherein the first state information further includes a first safety level derived from a number of occurrences of a diagnostic trouble code (DTC) related to overcharge and over-discharge of the battery, the second state information further includes a second safety level derived from a resistance, a reactance, and a Warburg impedance of the battery, and the third state information further includes a third safety level derived from a voltage change of the battery when charging.

In some implementations, the apparatus may further include storage that stores at least one of a first lookup table in which a safety level corresponding to the number of DCT occurrences related to the overcharge and the over-discharge of the battery is recorded, a second lookup table in which a SOH corresponding to the resistance, reactance, and Warburg impedance of the battery is recorded, a third lookup table in which a safety level corresponding to the resistance, reactance, and Warburg impedance of the battery is recorded, or a combination thereof.

In some implementations, the controller may obtain the number of DTC occurrences related to the overcharge and the over-discharge of the battery from a battery management system (BMS), and obtain the first safety level corresponding to the number of DTC occurrences related to the overcharge and the over-discharge of the battery based on the first lookup table.

In some implementations, the controller may obtain a Nyquist plot of the battery from electrochemical impedance spectroscopy (EIS) equipment, determine a resistance, a reactance, and a Warburg impedance based on the Nyquist plot, and obtain the second SOH corresponding to the resistance, the reactance, and the Warburg impedance based on the second lookup table.

In some implementations, the controller may obtain a Nyquist plot of the battery from electrochemical impedance spectroscopy (EIS) equipment, determine a resistance, a reactance, and a Warburg impedance based on the Nyquist plot, and obtain the second safety level corresponding to the resistance, the reactance, and the Warburg impedance based on the third lookup table.

In some implementations, the controller may diagnose the state of the battery based on the first SOH and the first safety level, the second SOH and the second safety level, and the third SOH and the third safety level.

In some implementations, the controller may classify the battery into a reuse class when the first SOH, the second SOH and the third SOH are within a first threshold range, and the first safety level, the second safety level and the third safety level are within a second threshold range.

In some implementations, the controller may classify the battery into a waste class when one of the first SOH, the second SOH and the third SOH is outside a first threshold range, or one of the first safety level, the second safety level and the third safety level is outside a second threshold range.

In some implementations, the controller may classify the battery into a reuse class when an average value of the first SOH, the second SOH and the third SOH exceeds a first threshold value, and an average value of the first safety level, the second safety level and the third safety level exceeds a second threshold value.

In some implementations, the controller may classify the battery into a waste class when an average value of the first SOH, the second SOH and the third SOH does not exceed a first threshold value, or an average value of the first safety level, the second safety level and the third safety level does not exceed a second threshold value.

According to an aspect of the present disclosure, a method of diagnosing a state of a battery includes obtaining, by a controller, at least one of first state information including a first state of health (SOH) used for diagnosing the battery, second state information including second SOH used for diagnosing the battery, or third state information including a third SOH used for diagnosing the battery, or a combination thereof, and diagnosing, by the controller, the state of the battery based on at least one piece of the first state information, the second state information, or the third state information, or the combination thereof, wherein the first state information further includes a first safety level derived from a number of occurrences of a diagnostic trouble code (DTC) related to overcharge and over-discharge of the battery, the second state information further includes a second safety level derived from a resistance, a reactance, and a Warburg impedance of the battery, and the third state information further includes a third safety level derived from a voltage change of the battery when charging.

In some implementations, the method may further include storing, by storage, at least one of a first lookup table in which a safety level corresponding to the number of DCT occurrences related to the overcharge and the over-discharge of the battery is recorded, a second lookup table in which a SOH corresponding to the resistance, reactance, and Warburg impedance of the battery is recorded, a third lookup table in which a safety level corresponding to the resistance, reactance, and Warburg impedance of the battery is recorded, or a combination thereof.

In some implementations, the obtaining of the first state information may include obtaining, by the controller, the number of DTC occurrences related to the overcharge and the over-discharge of the battery from a battery management system (BMS), and obtaining, by the controller, the first safety level corresponding to the number of DTC occurrences related to the overcharge and the over-discharge of the battery based on the first lookup table.

In some implementations, the obtaining of the second state information may include obtaining, by the controller, a Nyquist plot of the battery from electrochemical impedance spectroscopy (EIS) equipment, determining, by the controller, a resistance, a reactance, and a Warburg impedance based on the Nyquist plot, and obtaining, by the controller, the second SOH corresponding to the resistance, the reactance, and the Warburg impedance based on the second lookup table.

In some implementations, the obtaining of the second state information may include obtaining, by the controller, a Nyquist plot of the battery from electrochemical impedance spectroscopy (EIS) equipment, determining, by the controller, a resistance, a reactance, and a Warburg impedance based on the Nyquist plot, and obtaining, by the controller, the second safety level corresponding to the resistance, the reactance, and the Warburg impedance based on the third lookup table.

In some implementations, the diagnosing of the state of the battery may include diagnosing, by the controller, the state of the battery based on the first SOH and the first safety level, the second SOH and the second safety level, and the third SOH and the third safety level.

In some implementations, the diagnosing of the state of the battery may include classifying, by the controller, the battery into a reuse class when the first SOH, the second SOH and the third SOH are within a first threshold range, and the first safety level, the second safety level and the third safety level are within a second threshold range.

In some implementations, the diagnosing of the state of the battery may include classifying, by the controller, the battery into a waste class when one of the first SOH, the second SOH and the third SOH is outside a first threshold range, or one of the first safety level, the second safety level and the third safety level is outside a second threshold range.

In some implementations, the diagnosing of the state of the battery may include classifying, by the controller, the battery into a reuse class when an average value of the first SOH, the second SOH and the third SOH exceeds a first threshold value, and an average value of the first safety level, the second safety level and the third safety level exceeds a second threshold value.

In some implementations, the diagnosing of the state of the battery may include classifying, by the controller, the battery into a waste class when an average value of the first SOH, the second SOH, and the third SOH does not exceed a first threshold value, or an average value of the first safety level, the second safety level, and the third safety level does not exceed a second threshold value.

DETAILED DESCRIPTION

Figure 1:
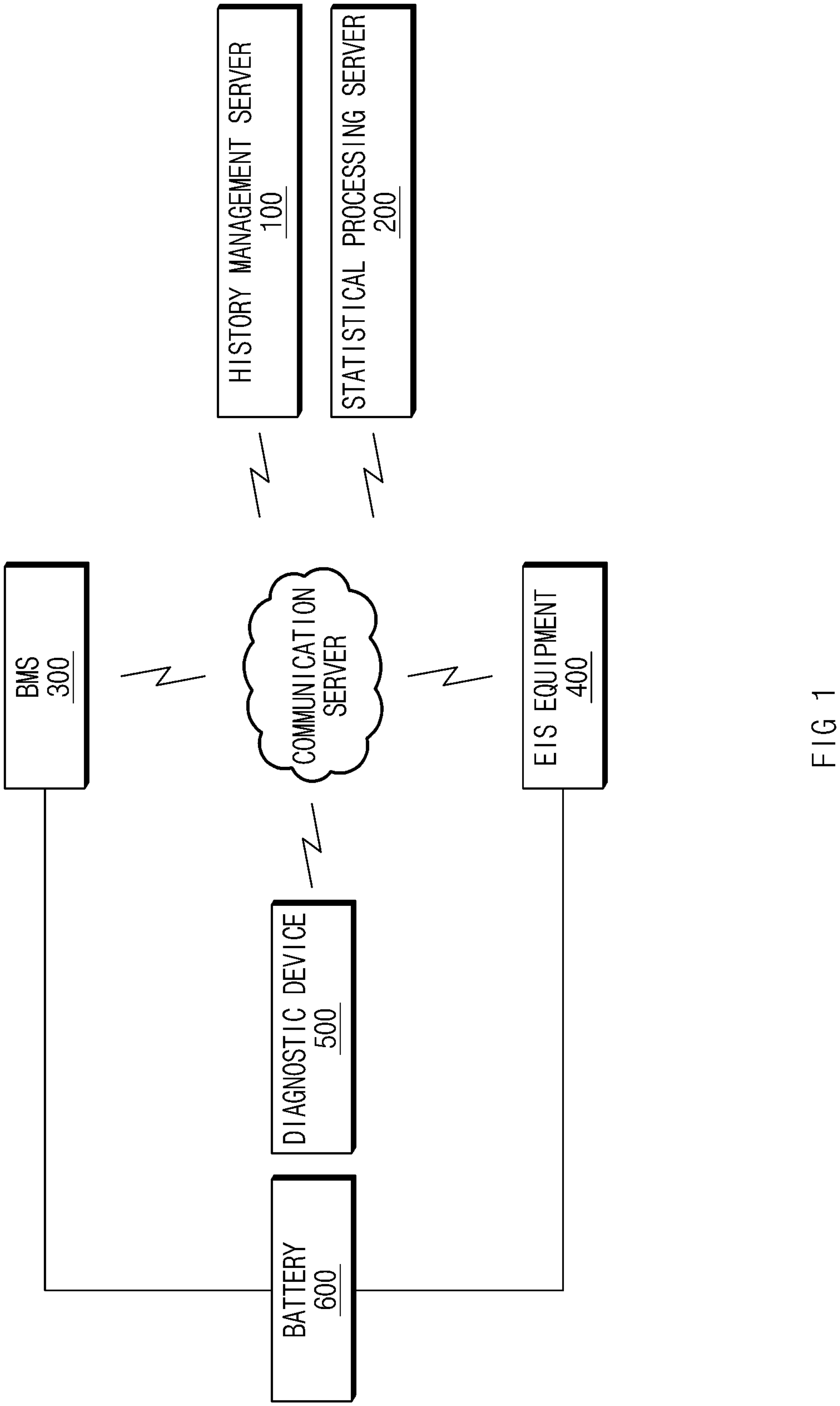
FIG. 1 is a block diagram illustrating an example of a system for diagnosing a state of a battery.

FIG. 1 is a block diagram illustrating a system for diagnosing a state of a battery.

As shown in FIG. 1, a system for diagnosing a state of a battery may include a history management server 100, a statistical processing server 200, a BMS 300, EIS equipment 400, a diagnostic device 500, and a battery 600. In this case, depending on a scheme of implementing a system for diagnosing a state of a battery, components may be combined with each other to be implemented as one, or some components may be omitted. In particular, the history management server 100 and the statistical processing server 200 may be implemented as one server.

The history management server 100 may communicate with the BMS 300 to obtain time series data used to determine the state of the battery 600. In this case, the time series data may include a pack voltage of the battery 600, a module voltage of the battery 600, a cell voltage of the battery 600, a current of the battery 600, a temperature of the battery 600, a coolant temperature, a cell balancing time and number, a slow charging number and energy amount, a fast charging number and energy amount, an accumulated charging power amount and energy amount, an accumulated discharge power amount, and an energy amount.

The history management server 100 may determine the SOH of the battery 600, determine the remaining life of the battery 600, and determine the safety level of the battery 600 based on time series data. In this case, the history management server 100 may determine the SOH, remaining life, and safety level of the battery 600 by using high computing power (HCP) diagnosis logic. For example, the history management server 100 determines the voltage change when charging the battery 600 based on time series data, and can determine the safety level of the battery 600 based on the voltage change of the battery 600 when charging. At this time, the greater the voltage change, the lower the safety level.

In addition, the history management server 100 may diagnose the state of the battery 600 based on the SOH, remaining life and safety level of the battery 600.

The statistical processing server 200 may receive a diagnosis result by the diagnostic device 500 from the diagnostic device 500 and perform statistical processing on the diagnostic result. For example, the statistical processing server 200 may receive the resistance value, reactance value and Warburg impedance of the battery 600 from the diagnostic device 500, and determine a statistical value (e.g., an average) of the resistance value, a statistical value of the reactance value and a statistical value of the Warburg impedance value. In this case, the Warburg impedance value may be replaced with a capacitor value that causes a reactance value.

The BMS 300, which is a module located in the pack of the battery 600 and manages the battery 600, may manage the SOH of the battery 600, the state of charge (SOC) of the battery 600, the pack voltage of the battery 600, the module voltage of the battery 600, the cell voltage of the battery 600, the current of the battery 600, the temperature of the battery 600, the coolant temperature, the cell balancing time and number, the slow charging number and energy amount, the fast charging number and energy amount, the accumulated charging power amount and energy amount, the accumulated discharge power amount and energy amount, the DTC occurrence history information, and the like. In this case, the DTC occurrence history information may include DTCs that occur due to the overcharge of the battery 600, the number of occurrences of DTCs related to the overcharging, DTCs that occur due to the over-discharge of the battery 600, and the number of occurrences of DTCs related to the over-discharge.

The EIS equipment 400 may apply an alternating voltage to the battery 600 to obtain an impedance (Z), display the real part (resistance) of the impedance on the x-axis, and display the imaginary part (reactance) of the impedance on the y-axis to generate a Nyquist plot. In this case, the EIS equipment 400 may generate the Nyquist plot by displaying the real part (resistance) of the impedance on the y-axis and the imaginary part (reactance) of the impedance on the x-axis. For example, the Nyquist plot is as shown in FIG. 2.

Figure 2:
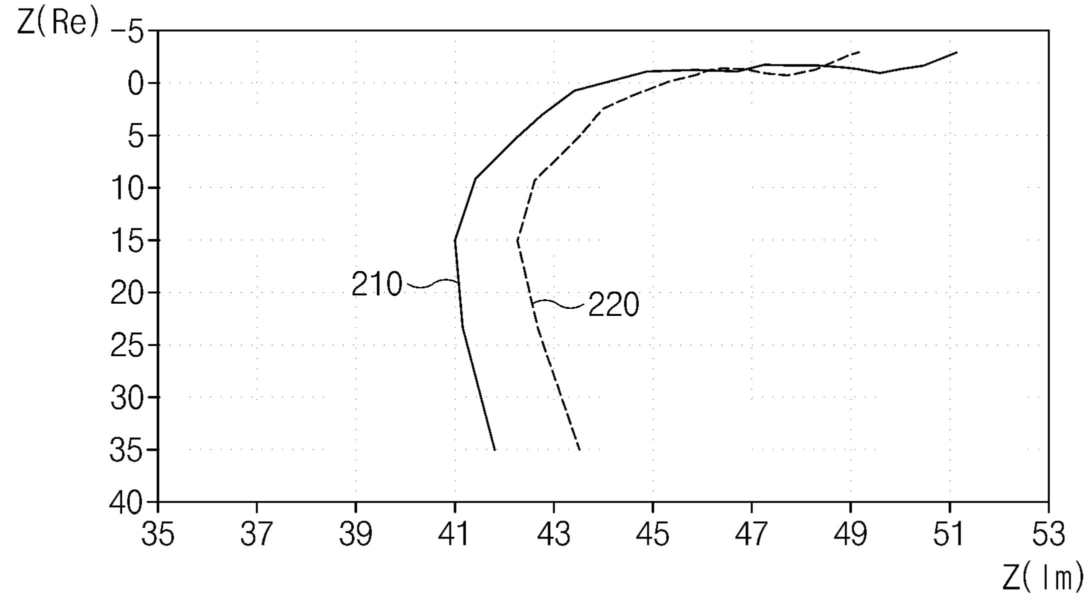
FIG. 2 is a diagram illustrating an example of a Nyquist plot generated by EIS equipment provided in a system for diagnosing a state of a battery.

FIG. 2 is a diagram illustrating an example of a Nyquist plot generated by EIS equipment provided in a system for diagnosing a state of a battery.

In FIG. 2, the x-axis represents the real part (real impedance) of the impedance (Z), the y-axis represents the imaginary part (imaginary Impedance) of the impedance (Z), reference numeral 210 represents the Nyquist plot of the battery pack provided in the electric vehicle with a mileage of 80,000 km, and reference numeral '220' represents the Nyquist plot of the battery pack provided in the electric vehicle with a mileage of 240,000 km.

The EIS equipment 400 may determine the resistance, reactance, and Warburg impedance based on the Nyquist plot. As an example, the resistance, reactance, and Warburg impedance are as shown in FIG. 3.

Figure 3:
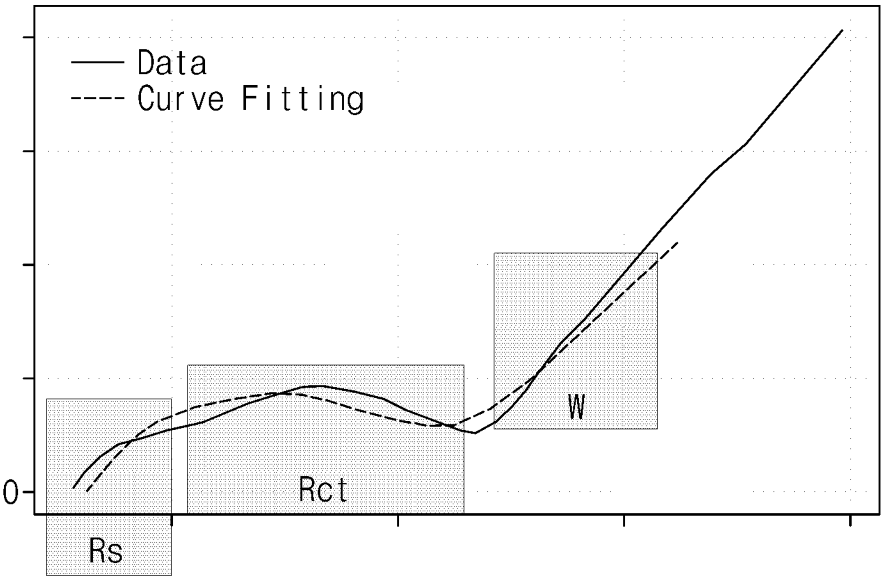
FIG. 3 is a diagram illustrating an example of a result derived from a Nyquist plot by the EIS equipment provided in a system for diagnosing a state of a battery.

FIG. 3 is a diagram illustrating a result derived from a Nyquist plot by the EIS equipment provided in a system for diagnosing a state of a battery.

In FIG. 3, $R_s$ represents a resistance, $R_{ct}$ represents a reactance, and 'W' represents a Warburg impedance. The resistance $R_s$, reactance $R_{ct}$ and Warburg impedance W may be used to diagnose the state of the battery 600. In addition, the EIS equipment 400 may transmit the resistance $R_s$, reactance $R_{ct}$ and Warburg impedance W to the diagnostic device 500.

Meanwhile, the diagnostic device 500 may be implemented as a portable device (e.g., a tablet, a smartphone, and the like).

The diagnostic device 500 may obtain the first state information of the battery 600 from the BMS 300, obtain the second state information of the battery 600 from the EIS equipment 400, obtain the third state information of the battery 600 from the history management server 100, and diagnose the state of the battery 600 based on the first state information, the second state information, and the third state information.

The diagnostic device 500 may obtain the first SOH of the battery 600 and the DTC information related to the overcharge and over-discharge of the battery 600 from the BMS 300, determine the first safety level of the battery 600 based on the table in which the safety level corresponding to the DTC is recorded, obtain the Nyquist plot of the battery 600 from the EIS equipment 400, determine the resistance, reactance, and Warburg impedance based on the Nyquist plot, determine the second SOH of the battery 600 based on the table in which the SOH corresponding to the resistance, reactance, and Warburg impedance is recorded, determine the second safety level of the battery 600 based on the table in which the safety level corresponding to the resistance, reactance, and Warburg impedance is recorded, obtain the third SOH and the third safety level of the battery 600 from the history management server 100, and diagnose the state of the battery 600 based on the first SOH, the first safety level, the second SOH and the second safety level, and the third SOH and the third safety level.

The diagnostic device 500 may obtain the SOH of the battery 600 and the DTC information related to the overcharge and over-discharge of the battery 600 from the BMS 300, determine the safety level of the battery 600 based on the table in which the safety level corresponding to the DTC is recorded, and diagnose the state of the battery 600 based on the SOH and the safety level of the battery 600.

The diagnostic device 500 may obtain the Nyquist plot of the battery 600 from the EIS equipment 400, determine the resistance, reactance, and Warburg impedance based on the Nyquist plot, determine the SOH of the battery based on the table in which the SOH corresponding to the resistance, reactance, and Warburg impedance is recorded, determine the safety level of the battery 600 based on the table in which the safety level corresponding to the resistance, reactance, and Warburg impedance is recorded, and diagnose the state of the battery 600 based on the SOH and safety level of the battery 600.

The diagnostic device 500 may obtain the SOH and safety level of the battery 600 from the history management server 100, and diagnose the state of the battery 600 based on the SOH and safety level of the battery 600.

Figure 4:
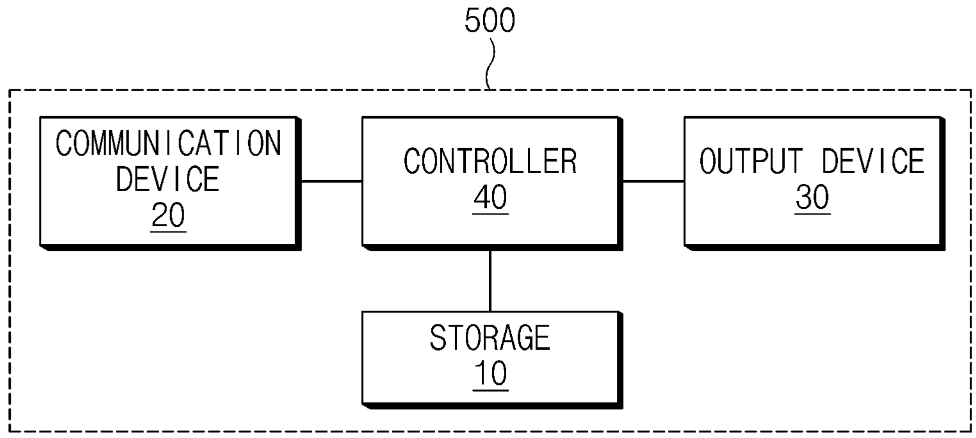
FIG. 4 is a block diagram illustrating an example of an apparatus for diagnosing a state of a battery.

FIG. 4 is a block diagram illustrating an apparatus for diagnosing a state of a battery. For example, an apparatus 500 may refer to the diagnostic device 500 described above.

As shown in FIG. 4, an apparatus 500 for diagnosing a state of a battery may include storage 10, a communication device 20, an output device 30, and a controller 40. In this case, depending on a scheme of implementing the apparatus 500 for diagnosing a state of a battery, components may be combined with each other to be implemented as one, or some components may be omitted.

Regarding each component, the storage 10 may store various logic, algorithms, and programs required in the processes of obtaining the first state information of the battery 600 from the BMS 300, obtaining the second state information of the battery 600 from the EIS equipment 400, obtaining the third state information of the battery 600 from the history management server 100, and diagnosing the state of the battery 600 based on the first state information, the second state information and the third state information.

The storage 10 may store various logic, algorithms, and programs required in the processes of obtaining the first SOH of the battery 600 and the DTC information related to the overcharge and over-discharge of the battery 600 from the BMS 300, determining the first safety level of the battery 600 based on the table in which the safety level corresponding to the DTC is recorded, obtaining the Nyquist plot of the battery 600 from the EIS equipment 400, determining the resistance, reactance, and Warburg impedance based on the Nyquist plot, determining the second SOH of the battery 600 based on the table in which the SOH corresponding to the resistance, reactance, and Warburg impedance is recorded, determining the second safety level of the battery 600 based on the table in which the safety level corresponding to the resistance, reactance, and Warburg impedance is recorded, obtaining the third SOH and the third safety level of the battery 600 from the history management server 100, and diagnosing the state of the battery 600 based on the first SOH, the first safety level, the second SOH and the second safety level, and the third SOH and the third safety level.

The storage 10 may store various logic, algorithms, and programs required in the processes of obtaining the SOH of the battery 600 and the DTC information related to the overcharge and over-discharge of the battery 600 from the BMS 300, determining the safety level of the battery 600 based on the table in which the safety level corresponding to the DTC is recorded, and diagnosing the state of the battery 600 based on the SOH and the safety level of the battery 600.

The storage 10 may store various logic, algorithms, and programs required in the processes of obtaining the Nyquist plot of the battery 600 from the EIS equipment 400, determining the resistance, reactance, and Warburg impedance based on the Nyquist plot, determining the SOH of the battery based on the table in which the SOH corresponding to the resistance, reactance, and Warburg impedance is recorded, determining the safety level of the battery 600 based on the table in which the safety level corresponding to the resistance, reactance, and Warburg impedance is recorded, and diagnosing the state of the battery 600 based on the SOH and safety level of the battery 600.

The storage 10 may store various logic, algorithms, and programs required in the processes of obtaining the SOH and safety level of the battery 600 from the history management server 100, and diagnosing the state of the battery 600 based on the SOH and safety level of the battery 600.

The communication device 20, which is a module for providing a communication interface with the history management server 100, the statistics processing server 200, the BMS 300, and the EIS equipment 400, may include at least one of a mobile communication module, a wireless Internet module, and a short-range communication module.

The mobile communication module may communicate with the history management server 100 and the statistical processing server 200 through a mobile communication network constructed according to a technical standard or communication scheme for mobile communication (e.g., global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTEA), and the like).

The wireless Internet module, which is a module for wireless Internet access, may communicate with the history management server 100 and the statistical processing server 200 through wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and the like.

The short-range communication module may support short-range communication with the BMS 300 and the EIS equipment 400 by using at least one of Bluetooth™, radio frequency identification (RFID), infrared data association (IrDA), ultra wideband (UWB), ZigBee, near field communication (NFC), and wireless universal serial bus (USB) technology.

The output device 30 may display a diagnosis result of the battery 600 on a screen or output the diagnosis result in voice.

The controller 40 may perform overall control such that each component performs its function. The controller 40 may be implemented in the form of hardware or software, or may be implemented in a combination of hardware and software. Preferably, the controller 40 may be implemented as a microprocessor, but is not limited thereto.

The controller 40 may obtain the first state information of the battery 600 from the BMS 300, obtain the second state information of the battery 600 from the EIS equipment 400, obtain the third state information of the battery 600 from the history management server 100, and diagnose the state of the battery 600 based on at least one piece of the first state information, the second state information, or the third state information, or a combination thereof.

In this case, the controller 40 may obtain the first SOH of the battery 600 and the DTC information related to the overcharge and over-discharge of the battery 600 from the BMS 300, and determine the first safety level of the battery 600 based on the table in which the safety level corresponding to the DTC is recorded. In this case, the first state information may include the first SOH and the first safety level of the battery 600.

In this case, the controller 40 may obtain the Nyquist plot of the battery 600 from the EIS equipment 400, determine the resistance, reactance, and Warburg impedance based on the Nyquist plot, determine the second SOH of the battery 600 based on the table in which the SOH corresponding to the resistance, reactance, and Warburg impedance is recorded, and determine the second safety level of the battery 600 based on the table in which the safety level corresponding to the resistance, reactance, and Warburg impedance is recorded. In this case, the second state information may include the second SOH and the second safety level of the battery 600.

In addition, the controller 40 may obtain the third SOH and the third safety level of the battery from the history management server 100 as the third state information.

Accordingly, the controller 40 may diagnose the state of the battery 600 based on the first SOH, the first safety level, the second SOH and the second safety level, and the third SOH and the third safety level.

Meanwhile, the controller 40 may obtain the SOH of the battery 600 and the DTC information related to the overcharge and over-discharge of the battery 600 from the BMS 300, determine the safety level of the battery 600 based on the table in which the safety level corresponding to the DTC is recorded, and diagnose the state of the battery 600 based on the SOH and the safety level of the battery 600.

In addition, the controller 40 may obtain the Nyquist plot of the battery 600 from the EIS equipment 400, determine the resistance, reactance, and Warburg impedance based on the Nyquist plot, determine the SOH of the battery based on the table in which the SOH corresponding to the resistance, reactance, and Warburg impedance is recorded, determine the safety level of the battery 600 based on the table in which the safety level corresponding to the resistance, reactance, and Warburg impedance is recorded, and diagnose the state of the battery 600 based on the SOH and safety level of the battery 600.

In addition, the controller 40 may obtain the SOH and safety level of the battery 600 from the history management server 100, and diagnose the state of the battery 600 based on the SOH and safety level of the battery 600.

Hereinafter, the operation of the controller 40 will be described in detail with reference to FIG. 5.

Figure 5:
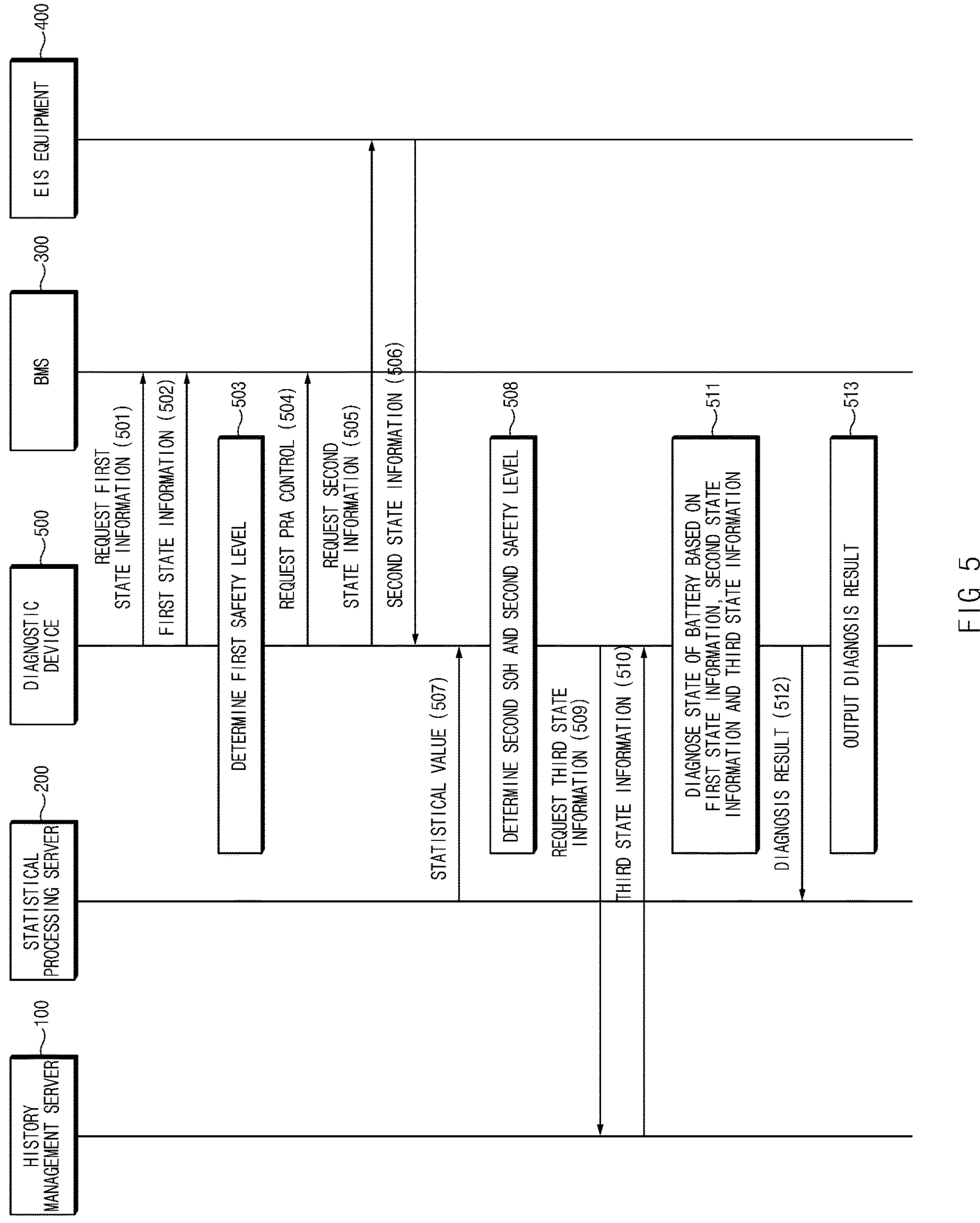
FIG. 5 is a flowchart illustrating an example of a method of diagnosing a state of a battery.

FIG. 5 is a flowchart illustrating a method of diagnosing a state of a battery.

First, the controller 40 may request the first state information from the BMS 300 in 501. In this case, the first state information may include the SOH of the battery 600, the number of occurrences of DTCs related to overcharging of the battery 600, and the number of occurrences of DTCs related to over-discharging of the battery 600.

Then, the controller 40 may receive the first state information from the BMS 300 in 502.

Then, the controller 40 may determine the first safety level corresponding to the number of occurrences of DTCs related to overcharging and the number of occurrences of DTCs related to over-discharge of the battery 600 based on the first lookup table in 503. In this case, the first lookup table is stored in the storage 10.

Then, the controller 40 may request power relay assembly (PRA) control from the BMS 300 in 504. That is, the controller 40 may request relay close control from the BMS 300 such that the EIS equipment 400 obtains the impedance (Z) by applying AC voltage to the battery 600. For reference, the EIS equipment 400 may generate the Nyquist plot of the battery 600 only when being in a PRA close state.

Then, the controller 40 may request the second state information from the EIS equipment 400 in 505. In this case, the second state information may include the resistance, reactance, and Warburg impedance.

Then, the controller 40 may determine whether all of the second state information obtained from the EIS equipment 400 is within a normal range based on the statistical value received from the statistical processing server 200 in 507. For example, the controller 40 determines whether the error between the resistance value received from the EIS equipment 400 and the resistance statistical value is within a threshold value, whether the error between the reactance value received from the EIS equipment 400 and the reactance statistical value is within a threshold value, and whether the error between the Warburg impedance value received from the EIS equipment 400 and the Warburg impedance statistical value is within a threshold value.

Then, in 508, the controller 40 may determine the second SOH corresponding to the resistance, reactance, and Warburg impedance based on the second lookup table, and determine the second safety level corresponding to the resistance, reactance, and Warburg impedance based on the third lookup table.

Then, the controller 40 may request the third state information from the history management server 100 in 509.

Then, the controller 40 may receive the third state information from the history management server 100 in 510.

Then, the controller 40 may diagnose the state of the battery 600 based on the first state information, the second state information and the third state information in 511. That is, the controller 40 may diagnose the state of the battery 600 based on the first SOH and the first safety level, the second SOH and the second safety level, and the third SOH and the third safety level.

As a first example, the controller 40 may classify the battery 600 into the reuse class when the first SOH, the second SOH and the third SOH are within a first threshold range, and the first safety level, the second safety level and the third safety level are within a second threshold range. In this case, the reuse class may include remanufacturing as an electric vehicle battery as well as reuse as an energy storage system (ESS). In addition, the controller 40 may classify the battery 600 into a waste class when one of the first SOH, the second SOH and the third SOH is outside the first threshold range, or one of the first safety level, the second safety level and the third safety level is outside the second threshold range.

As a second example, when the average value of the first SOH, the second SOH and the third SOH exceeds the first threshold value, and the average value of the first safety level, the second safety level and the third safety level exceeds the second threshold value, the battery 600 may be classified into the reuse class. When the average value of the first SOH, the second SOH and the third SOH does not exceed the first threshold value, or the average value of the first safety level, the second safety level and the third safety level does not exceed the second threshold value, the battery 600 may be classified into the waste class. In this case, the waste class may be a class in which only recyclable parts are extracted from the battery 600 and the rest is discarded.

As a third example, the controller 40 may give priority to the first SOH, the second SOH and the third SOH. The controller 40 may give priority to the first safety level, the second safety level, and the third safety level when two high-priority SOHs are within the first threshold range. The controller 40 may classify the battery 600 into the reuse class when the two high-priority safety levels are within a threshold range. The controller 40 may classify the battery 600 into the waste class when one of the two high-priority SOHs is out of the first threshold range or one of the two high-priority safety levels is out of the second threshold range.

Then, the controller 40 may transmit the diagnosis result to the statistical processing server 200 in 512.

Then, the controller 40 may output the diagnosis result through the output device 30 in 513.

Figure 6:
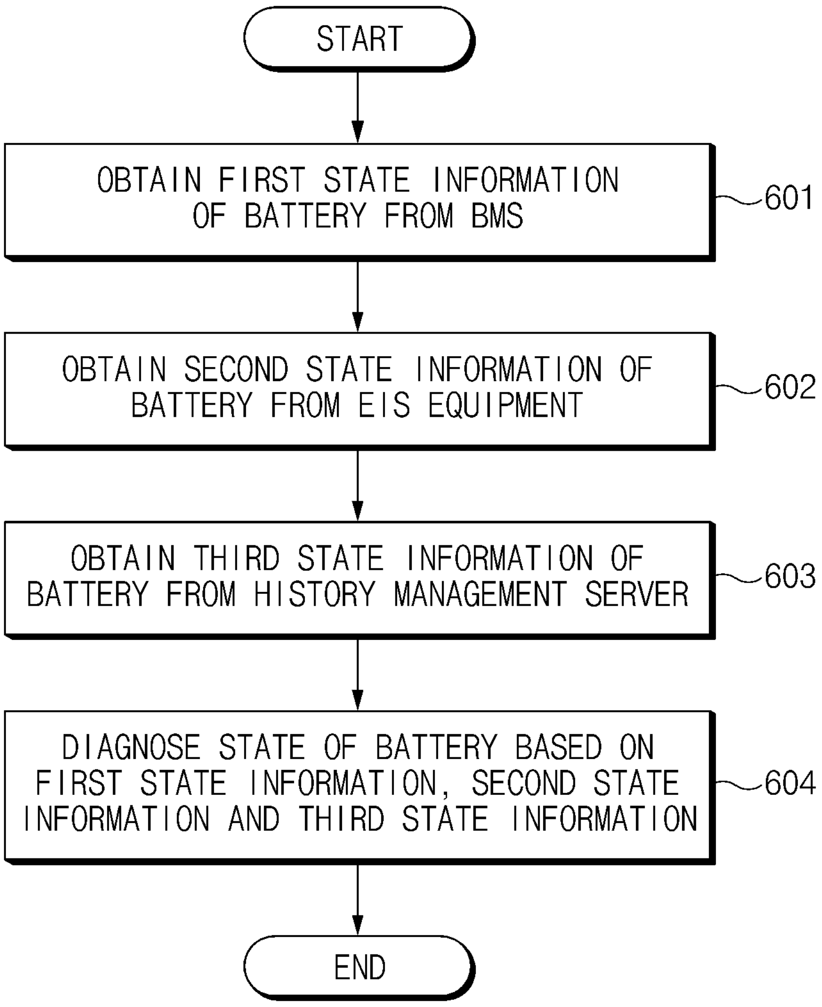
FIG. 6 is a flowchart illustrating an example of a method for diagnosing a state of a battery.

FIG. 6 is a flowchart illustrating a method for diagnosing a state of a battery.

First, the controller obtains the first state information of the battery 600 from the BMS 300 in 601.

Then, the controller 40 obtains the second state information of the battery 600 from the EIS equipment 400 in 602.

Then, the controller 40 obtains the third state information of the battery 600 from the history management server 100 in 603.

Then, the controller 40 diagnoses the state of the battery 600 based on the first state information, the second state information, and the third state information in 604.

Figure 7:
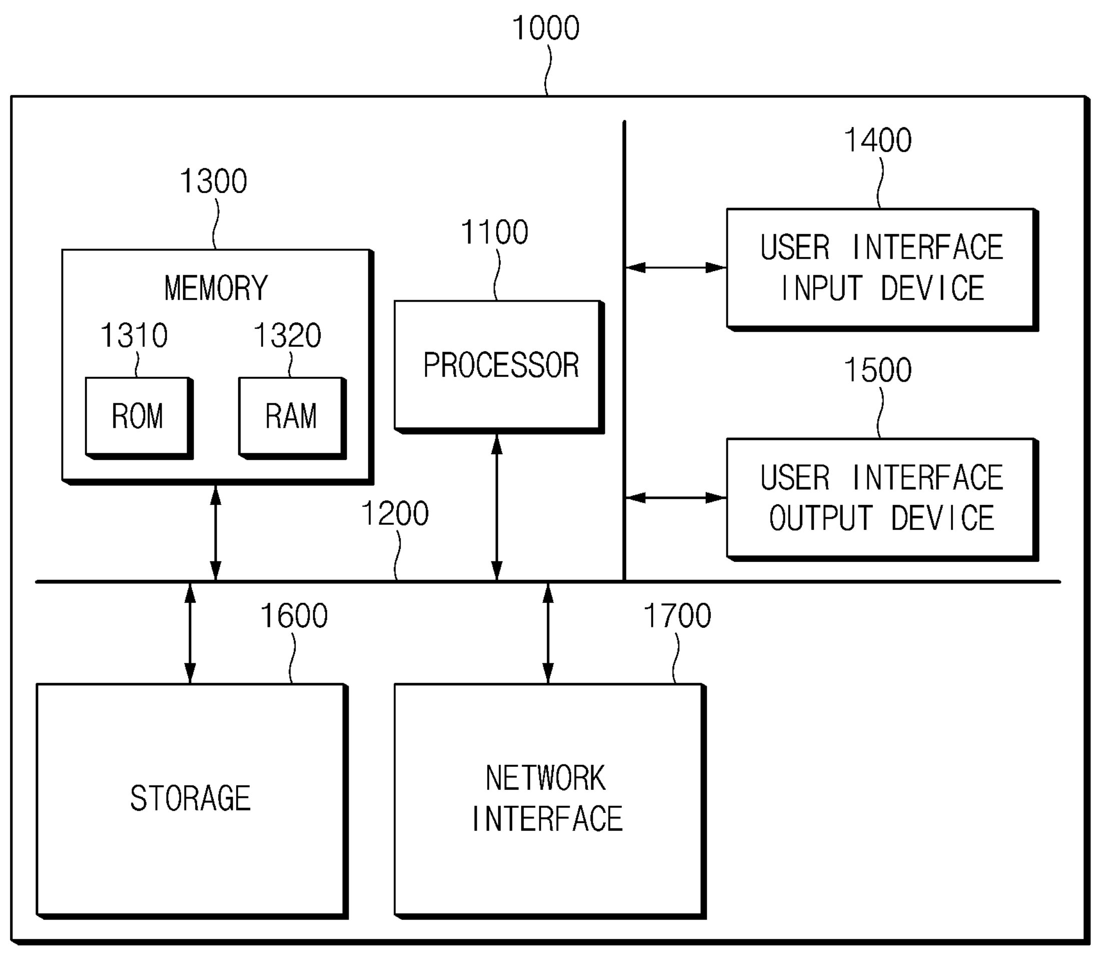
FIG. 7 is a block diagram illustrating an example of a computing system for executing a method of diagnosing a state of a battery.

FIG. 7 is a block diagram illustrating a computing system for executing a method of diagnosing a state of a battery.

Referring to FIG. 7, a method of diagnosing a state of a battery according to an implementation of the present disclosure described above may be implemented through a computing system 1000. The computing system 1000 may include at least one processor 1100, a memory 1300, a user interface input device 1400, a user interface output device 1500, storage 1600, and a network interface 1700 connected through a system bus 1200.

The processor 1100 may be a central processing device (CPU) or a semiconductor device that processes instructions stored in the memory 1300 and/or the storage 1600. The memory 1300 and the storage 1600 may include various types of volatile or non-volatile storage media. For example, the memory 1300 may include a ROM (Read Only Memory) 1310 and a RAM (Random Access Memory) 1320.

Accordingly, the processes of the method or algorithm described in relation to the implementations of the present disclosure may be implemented directly by hardware executed by the processor 1100, a software module, or a combination thereof. The software module may reside in a storage medium (that is, the memory 1300 and/or the storage 1600), such as a RAM, a flash memory, a ROM, an EPROM, an EEPROM, a register, a hard disk, solid state drive (SSD), a detachable disk, or a CD-ROM. The exemplary storage medium is coupled to the processor 1100, and the processor 1100 may read information from the storage medium and may write information in the storage medium. In another method, the storage medium may be integrated with the processor 1100. The processor 1100 and the storage medium may reside in an application specific integrated circuit (ASIC). The ASIC may reside in a user terminal. In another method, the processor 1100 and the storage medium may reside in the user terminal as an individual component.

According to the implementations of the present disclosure, it is possible to diagnose the state of the battery with high accuracy in a short time period by obtaining the first state information of the battery from the BMS, obtaining the second state information of the battery from the EIS equipment, obtaining the third state information of the battery from the history management server, and diagnosing the state of the battery based on the first state information, the second state information and the third state information.

Although exemplary implementations of the present disclosure have been described for illustrative purposes, those skilled in the art will appreciate that various modifications, additions and substitutions are possible, without departing from the scope and spirit of the disclosure. Therefore, the exemplary implementations disclosed in the present disclosure are provided for the sake of descriptions, not limiting the technical concepts of the present disclosure, and it should be understood that such exemplary implementations are not intended to limit the scope of the technical concepts of the present disclosure. The protection scope of the present disclosure should be understood by the claims below, and all the technical concepts within the equivalent scopes should be interpreted to be within the scope of the right of the present disclosure.

What is claimed is:

1. An apparatus configured to determine a state of a battery, the apparatus comprising:

a controller configured to execute instructions to perform operations comprising:

obtaining at least one of first state information including a first state of health (SOH) related to diagnosis of the battery, second state information including a second SOH related to diagnosis of the battery, or third state information including a third SOH related to diagnosis of the battery, and determining the state of the battery based on at least one of the first state information, the second state information, or the third state information; and an output device configured to output the determined state of the battery, wherein:

the first state information further includes a first safety level derived from a number of occurrences of a diagnostic trouble code (DTC) related to overcharge and over-discharge of the battery, the second state information further includes a second safety level derived from a resistance, a reactance, and a Warburg impedance of the battery, and the third state information further includes a third safety level derived from a voltage change of the battery based on the battery being charged.

2. The apparatus of claim 1, further comprising:

storage configured to store at least one of (i) a first lookup table in which a safety level corresponding to the number of DTC occurrences related to the overcharge and the over-discharge of the battery is recorded, (ii) a second lookup table in which a SOH corresponding to the resistance, reactance, and Warburg impedance of the battery is recorded, or (iii) a third lookup table in which a safety level corresponding to the resistance, reactance, and Warburg impedance of the battery is recorded.

3. The apparatus of claim 2, wherein obtaining the first state information comprises:

obtaining, from a battery management system (BMS), the number of DTC occurrences related to the overcharge and the over-discharge of the battery, and obtaining the first safety level corresponding to the number of DTC occurrences related to the overcharge and the over-discharge of the battery based on the first lookup table.

4. The apparatus of claim 2, wherein obtaining the second state information comprises:

obtaining a Nyquist plot of the battery from electrochemical impedance spectroscopy (EIS) equipment, determining a resistance, a reactance, and a Warburg impedance based on the Nyquist plot, and obtaining the second SOH corresponding to the resistance, the reactance, and the Warburg impedance based on the second lookup table.

5. The apparatus of claim 2, wherein obtaining the second state information comprises:

obtaining a Nyquist plot of the battery from electrochemical impedance spectroscopy (EIS) equipment, determining a resistance, a reactance, and a Warburg impedance based on the Nyquist plot, and obtaining the second safety level corresponding to the resistance, the reactance, and the Warburg impedance based on the third lookup table.

6. The apparatus of claim 1, wherein determining the state of the battery comprises determining the state of the battery based on the first SOH and the first safety level, the second SOH and the second safety level, and the third SOH and the third safety level.

7. The apparatus of claim 6, wherein determining the state of the battery comprises:

classifying, based on (i) the first SOH, the second SOH, and the third SOH being within a predetermined first threshold range and (ii) the first safety level, the second safety level, and the third safety level being within a predetermined second threshold range, the battery into a reuse class.

8. The apparatus of claim 6, wherein determining the state of the battery comprises:

classifying, based on (i) one of the first SOH, the second SOH, or the third SOH falling outside a predetermined first threshold range or (ii) one of the first safety level, the second safety level and the third safety level falling outside a predetermined second threshold range, the battery into a waste class.

9. The apparatus of claim 6, wherein determining the state of the battery comprises:

classifying, based on (i) an average value of the first SOH, the second SOH, and the third SOH being greater than a predetermined first threshold value and (ii) an average value of the first safety level, the second safety level, and the third safety level being greater than a predetermined second threshold value, the battery into a reuse class.

10. The apparatus of claim 6, wherein determining the state of the battery comprises:

classifying, based on (i) an average value of the first SOH, the second SOH, and the third SOH being equal to or less than a predetermined first threshold value or (ii) an average value of the first safety level, the second safety level, and the third safety level being equal to or less than a predetermined second threshold value, the battery into a waste class.

11. A method of determining a state of a battery using a batter diagnostic apparatus comprising a controller and an output device, the method comprising:

obtaining, by the controller, at least one of first state information including a first state of health (SOH) related to diagnosis of the battery, second state information including a second SOH related to diagnosis of the battery, or third state information including a third SOH related to diagnosis of the battery;

requesting, by the controller, relay close control from a battery management system (BMS) such that electrochemical impedance spectroscopy (EIS) equipment applies an AC voltage to the battery to obtain an impedance of the battery;

determining, by the controller, whether all of the second state information obtained from the EIS equipment is within a normal range based on a statistical value received from a statistical processing server;

determining, by the controller, the state of the battery based on at least one of the first state information, the second state information, or the third state information; and outputting, via the output device, the determined state of the battery, wherein:

the first state information further includes a first safety level derived from a number of occurrences of a diagnostic trouble code (DTC) related to overcharge and over-discharge of the battery, the second state information further includes a second safety level derived from a resistance, a reactance, and a Warburg impedance of the battery, and the third state information further includes a third safety level derived from a voltage change of the battery based on the battery being charged.

12. The method of claim 11, further comprising:

storing, at a storage, at least one of (i) a first lookup table in which a safety level corresponding to the number of DTC occurrences related to the overcharge and the over-discharge of the battery is recorded, (ii) a second lookup table in which a SOH corresponding to the resistance, reactance, and Warburg impedance of the battery is recorded, or (iii) a third lookup table in which a safety level corresponding to the resistance, reactance, and Warburg impedance of the battery is recorded.

13. The method of claim 12, wherein obtaining the first state information includes:

obtaining, by the controller, the number of DTC occurrences related to the overcharge and the over-discharge of the battery, from a battery management system (BMS), and obtaining, by the controller, the first safety level corresponding to the number of DTC occurrences related to the overcharge and the over-discharge of the battery based on the first lookup table.

14. The method of claim 12, wherein obtaining the second state information includes:

obtaining, by the controller, a Nyquist plot of the battery from electrochemical impedance spectroscopy (EIS) equipment, determining, by the controller, a resistance, a reactance, and a Warburg impedance based on the Nyquist plot, and obtaining, by the controller, the second SOH corresponding to the resistance, the reactance, and the Warburg impedance based on the second lookup table.

15. The method of claim 12, wherein obtaining the second state information includes:

obtaining, by the controller, a Nyquist plot of the battery from electrochemical impedance spectroscopy (EIS) equipment, determining, by the controller, a resistance, a reactance, and a Warburg impedance based on the Nyquist plot, and obtaining, by the controller, the second safety level corresponding to the resistance, the reactance, and the Warburg impedance based on the third lookup table.

16. The method of claim 11, wherein determining the state of the battery includes:

determining, by the controller, the state of the battery based on the first SOH and the first safety level, the second SOH and the second safety level, and the third SOH and the third safety level.

17. The method of claim 16, wherein determinining the state of the battery includes:

classifying, based on (i) the first SOH, the second SOH, and the third SOH being within a predetermined first threshold range and (ii) the first safety level, the second safety level, and the third safety level being within a predetermined second threshold range, the battery into a reuse class.

18. The method of claim 16, wherein determining the state of the battery includes:

classifying, based on (i) one of the first SOH, the second SOH, or the third SOH falling outside a predetermined first threshold range or (ii) one of the first safety level, the second safety level and the third safety level falling outside a predetermined second threshold range, the battery into a waste class.

19. The method of claim 16, wherein determining the state of the battery includes:

classifying, based on (i) an average value of the first SOH, the second SOH, and the third SOH being greater than a predetermined first threshold value and (ii) an average value of the first safety level, the second safety level, and the third safety level being greater than a predetermined second threshold value, the battery into a reuse class.

20. The method of claim 16, wherein determining the state of the battery includes:

classifying, based on (i) an average value of the first SOH, the second SOH, and the third SOH being equal to or less than a predetermined first threshold value or (ii) an average value of the first safety level, the second safety level, and the third safety level being equal to or less than a predetermined second threshold value, the battery into a waste class.

* * * * *